United States Patent
Do et al.

(10) Patent No.: US 8,138,024 B2
(45) Date of Patent: Mar. 20, 2012

(54) PACKAGE SYSTEM FOR SHIELDING SEMICONDUCTOR DIES FROM ELECTROMAGNETIC INTERFERENCE

(75) Inventors: Byung Tai Do, Singapore (SG); Rui Huang, Singapore (SG); Seng Guan Chow, Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 128 days.

(21) Appl. No.: 12/037,774

(22) Filed: Feb. 26, 2008

(65) Prior Publication Data

US 2009/0212401 A1      Aug. 27, 2009

(51) Int. Cl.
*H01L 21/56* (2006.01)
*H01L 23/552* (2006.01)

(52) U.S. Cl. .......... 438/118; 257/659; 257/E21.502; 257/E23.114

(58) Field of Classification Search .......... 438/118; 257/659, E21.502, E23.114
See application file for complete search history.

(56) References Cited

U.S. PATENT DOCUMENTS

| 6,455,785 B1* | 9/2002 | Sakurai et al. ............... 174/260 |
| 7,030,469 B2 | 4/2006 | Mahadevan et al. |
| 7,148,576 B2 | 12/2006 | Nemoto |
| 7,198,987 B1 | 4/2007 | Warren et al. |
| 7,217,997 B2* | 5/2007 | Wyland ..................... 257/707 |
| 7,432,586 B2* | 10/2008 | Zhao et al. ................. 257/685 |
| 7,545,026 B2* | 6/2009 | Six ............................. 257/676 |
| 2007/0290322 A1* | 12/2007 | Zhao et al. ................. 257/690 |
| 2008/0211068 A1* | 9/2008 | Chen et al. ................. 257/666 |

* cited by examiner

*Primary Examiner* — David S Blum
(74) *Attorney, Agent, or Firm* — Mikio Ishimaru

(57) ABSTRACT

A method of manufacturing a package system includes: providing a semiconductor die with a contact pad and a ground pad, mounting the semiconductor die on a package substrate using and adhesive layer, forming a vertical conductive structure on top of the ground pad in the semiconductor die, encapsulating at least portions of the semiconductor die, the vertical conductive structure, and the package substrate using an encapsulant, covering at least portions of the encapsulant and the vertical conductive structure with a shielding layer to place the vertical conductive structure in electrical contact with the shielding layer, and connecting the shielding layer to the package substrate.

20 Claims, 4 Drawing Sheets

PACKAGE SYSTEM FOR SHIELDING SEMICONDUCTOR DIES FROM ELECTROMAGNETIC INTERFERENCE

TECHNICAL FIELD

The present invention relates generally to semiconductor packaging technology, and more particularly to a system for shielding electromagnetic interference (EMI) from semiconductor packages.

BACKGROUND ART

Semiconductor dies ("chips") containing integrated circuits need to be protected from external sources of electromagnetic radiation that may impact circuit operation. To prevent electromagnetic interference, groups of packaged semiconductor devices may be placed in a module or box. The module shields the semiconductor devices from electromagnetic interference (EMI). Even though a shielded module may provide overall EMI protection from outside interference, semiconductor devices inside the module can still interfere with each other.

Given the increased functionality of new electronic products such as advanced cell phones, there is a need for semiconductor packages that include features for shielding semiconductor dies from electromagnetic interference. Such functionality enables placing EMI-sensitive components in the proximity of sources of electromagnetic radiation.

The main issues with existing shielding approaches are the lack of lateral shielding of the semiconductor die and lack of an effective and reliable approach for connecting the shield to a ground loop using the least number of lead connections.

As new generations of electrical consumer products are developed there is a growing need to improve the functionality, performance, reliability, and manufacturing robustness of semiconductor packages. Additionally, miniaturization of handheld devices such as cell phones and smart cards impose restrictions on the overall thickness of the package.

Thus, a need still remains for a system for shielding semiconductor dies from electromagnetic interference that provides full enclosure protection of the semiconductor die using a minimum of lead connections. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a package system including: providing a semiconductor die with a contact pad and a ground pad, mounting the semiconductor die on a package substrate using and adhesive layer, forming a vertical conductive structure on top of the ground pad in the semiconductor die, encapsulating at least portions of the semiconductor die, the vertical conductive structure, and the package substrate using an encapsulant, covering at least portions of the encapsulant and the vertical conductive structure with a shielding layer to place the vertical conductive structure in electrical contact with the shielding layer, and connecting the shielding layer to the package substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
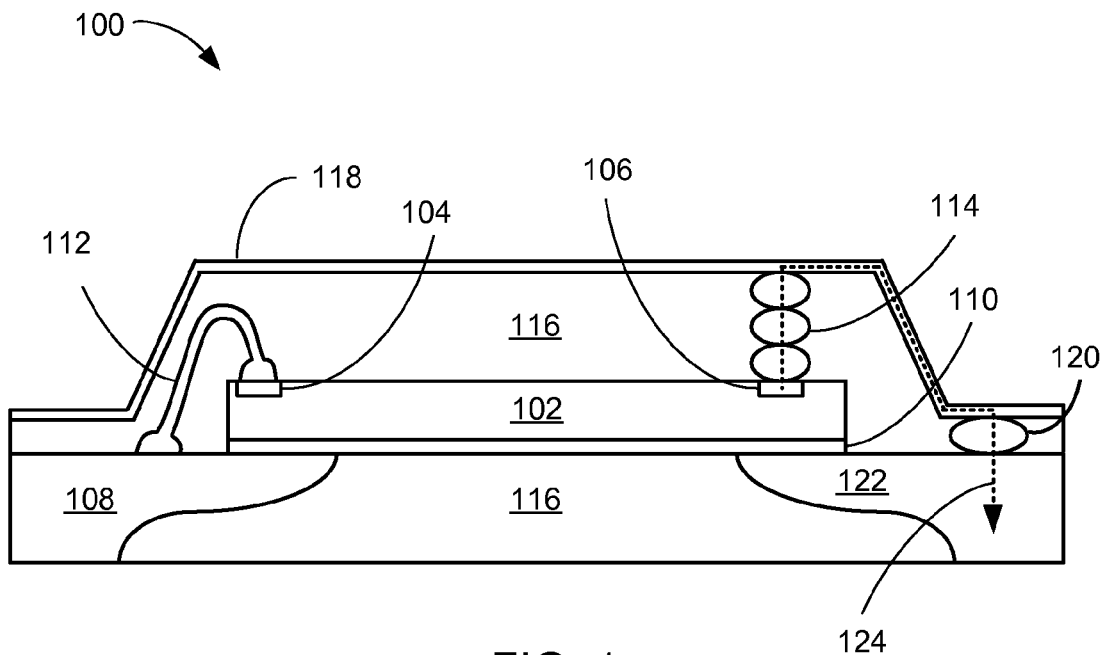
FIG. 1 is a cross-sectional view of a package system with electromagnetic interference shielding in a chip-on-lead (COL) embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact between or among elements. The term "system" as used herein refers to and is defined as the method and as the apparatus of the present invention in accordance with the context in which the term is used.

Referring now to FIG. 1, therein is shown a cross-sectional view of a package system 100 with electromagnetic interference shielding in a chip-on-lead (COL) embodiment of the present invention. A semiconductor die 102 with at least a contact pad 104 and a ground pad 106 is mounted on a leadframe 108 using an adhesive layer 110. The leadframe 108 is a package substrate that is employed in chip-on-lead packages such as the package system 100. A bond wire 112 provides an electrical connection between the contact pad 104 in the semiconductor die 102 and the leadframe 108.

A vertical conductive structure 114 provides an electrical connection between the ground pad 106 and a shielding layer 118. At least portions of the leadframe 108, the semiconductor die 102, the bond wire 112, and the vertical conductive structure 114 are surrounded by an encapsulant 116.

In one embodiment of the invention, the vertical conductive structure 114 is formed using a stack of conductive bumps such gold stud bumps or solder balls. In an alternate embodiment of the invention, the vertical conductive structure 114 is formed by extruding a conductive bump to form a metal pillar. Materials used to form the vertical conductive structure include gold (Au), copper (Cu), aluminum (Al), their alloys, and solder materials.

The shielding layer 118 is provided to protect the package system 100 from electromagnetic interference (EMI). The shielding layer 118 may be a metal, metal alloy, a conductive polymer, or a conductive ceramic. Moreover, the shielding layer 118 may be coated on top of the encapsulant 116 by fabrication methods known in the art such as plating, sputtering, spraying, and painting.

A path to ground 124 from the ground pad 106 to a ground lead 122 is provided by the vertical conductive structure 114, a portion of the shielding layer 118, and a conductive bump or ball 120 placed between the shielding layer 118 and the ground lead 122. The shielding layer 118 is only on an exterior of the encapsulant 116 and forms the path to ground 124 from the vertical conductive structure 114 through the shielding layer 118 and through the leadframe 108.

An important advantage of the package system 100 shown in FIG. 1 is that the shielding layer 118 provides electromagnetic interference (EMI) and radiofrequency interference (RFI) shielding around the package system 100 including the lateral portions of the package system 100. In addition, the availability of the vertical conductive structure 114 eliminates the need for the bond wire 112 for ground connections. The package system 100 can thus be implemented using the ground lead 122 as the only external ground connection and the vertical conductive structure 114 providing the sole path to ground 124 for the semiconductor die 102.

Figure 2:
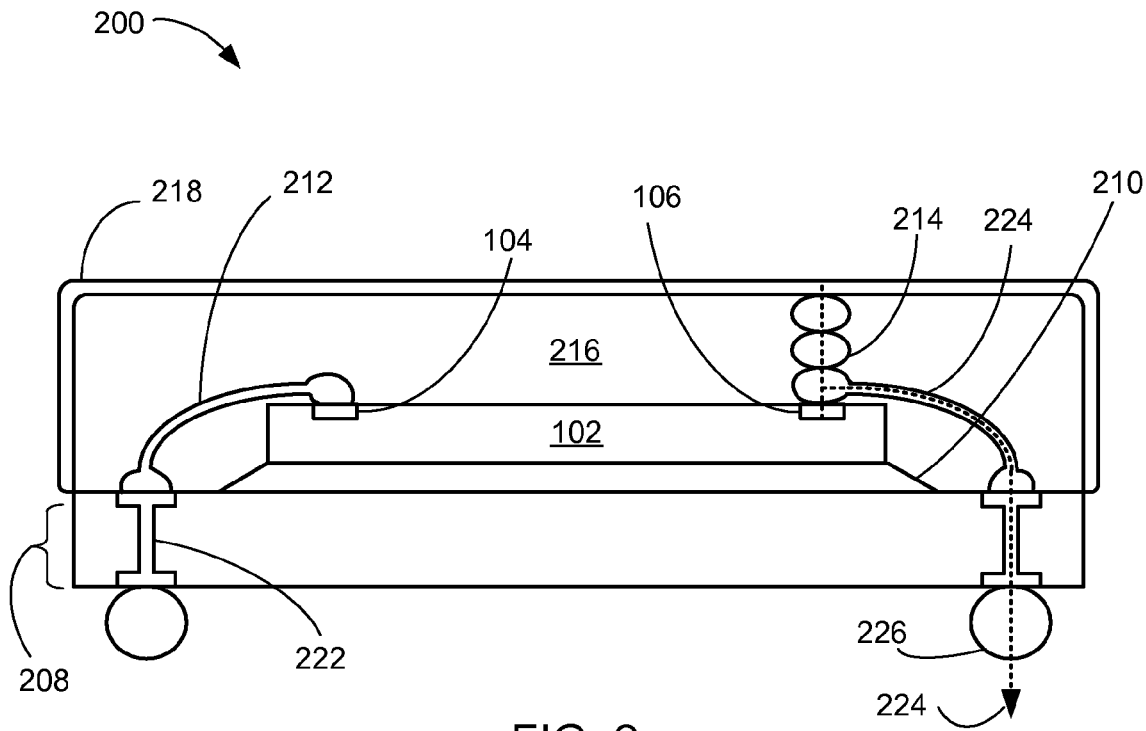
FIG. 2 is a cross-sectional view of a package system with electromagnetic interference shielding in an embodiment of the invention for package stacking configurations.

Referring now to FIG. 2, therein is shown a cross-sectional view of a package system 200 with electromagnetic interference shielding in an embodiment of the invention for package stacking configurations. In the package system 200, the semiconductor die 102 is mounted on a package substrate 208 using an adhesive layer 210. A bond wire 212 provides an electrical connection between the contact pad 104 or the ground pad 106 in the semiconductor die 102 and a conductive through connector 222 in the package substrate 208.

A vertical conductive structure 214 provides an electrical connection between the ground pad 106 and a shielding layer 218. In the embodiment of the invention exemplified by the package system 200, the vertical conductive structure 214 is formed on top of the bond wire 212 connected to the ground pad 106. At least portions of the package substrate 208, the semiconductor die 102, the bond wire 212, and the vertical conductive structure 214 are surrounded by an encapsulant 216.

In one embodiment of the invention, the vertical conductive structure 214 is formed using a stack of conductive bumps such gold stud bumps or solder balls. In an alternate embodiment of the invention, the vertical conductive structure 214 is formed by extruding a conductive bump to form a metal pillar. Materials used to form the vertical conductive structure include gold (Au), copper (Cu), aluminum (Al), their alloys, and solder materials.

The shielding layer 218 is provided to protect the package system 200 from electromagnetic interference (EMI). The shielding layer 218 may be a metal, metal alloy, a conductive polymer, or a conductive ceramic. Moreover, the shielding layer 218 may be coated on top of the encapsulant 216 by fabrication methods known in the art such as plating, sputtering, spraying, and painting.

A path to ground 224 from the ground pad 106 and the shielding layer 218 is provided by the vertical conductive structure 214, the bond wire 212, the conductive through connector 222, and a conductive bump or ball 226.

An important advantage of the package system 200 shown in FIG. 2 is that the shielding layer 218 provides electromagnetic interference (EMI) and radiofrequency interference (RFI) shielding around the package system 200 including the lateral portions of the package system 200. In addition, similar to the package system 100 in FIG. 1, the embodiment of the invention represented by the package system 200 provides the path to ground 224 for both the shielding layer 218 and the ground pad 106.

Figure 3:
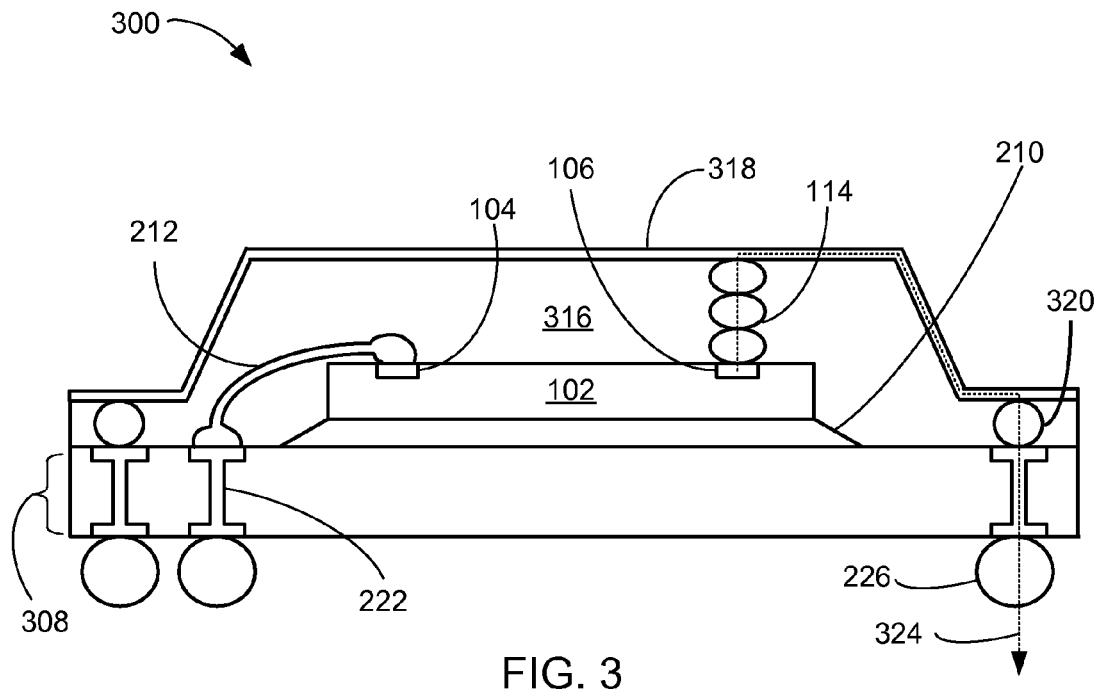
FIG. 3 is a cross-sectional view of a package system with electromagnetic interference shielding in an embodiment of a package stacking configuration.

Referring now to FIG. 3, therein is shown a cross-sectional view of a package system 300 with electromagnetic interference shielding in an embodiment of a package stacking configuration. In the package system 300, the semiconductor die 102 is mounted on a package substrate 308 using the adhesive layer 210. The bond wire 212 provides an electrical connection between the contact pad 104 in the semiconductor die 102 and the conductive through connector 222 in the package substrate 308.

The vertical conductive structure 114 provides an electrical connection between the ground pad 106 and a shielding layer 318. A solder ball 320 provides an electrical connection between the shielding layer 318 and the conductive through connector 222 in the package substrate 308. At least portions of the package substrate 308, the semiconductor die 102, and the bond wire 212, the solder ball 320, and the vertical conductive structure 114 are surrounded by an encapsulant 316.

The shielding layer 318 is provided to protect the package system 300 from electromagnetic interference (EMI). The shielding layer 318 may be a metal, metal alloy, a conductive polymer, or a conductive ceramic. In the embodiment of the invention exemplified by the package system 300, a path to ground 324 is defined by the ground pad 106, the vertical conductive structure 114, the shielding layer 318, the solder ball 320, the conductive through connector 222, and the conductive bump or ball 226. The shielding layer 318 is only on an exterior of the encapsulant 316 and forms the path to ground 324 from the vertical conductive structure 114 through the shielding layer 318 and through the package substrate 308.

Figure 4:
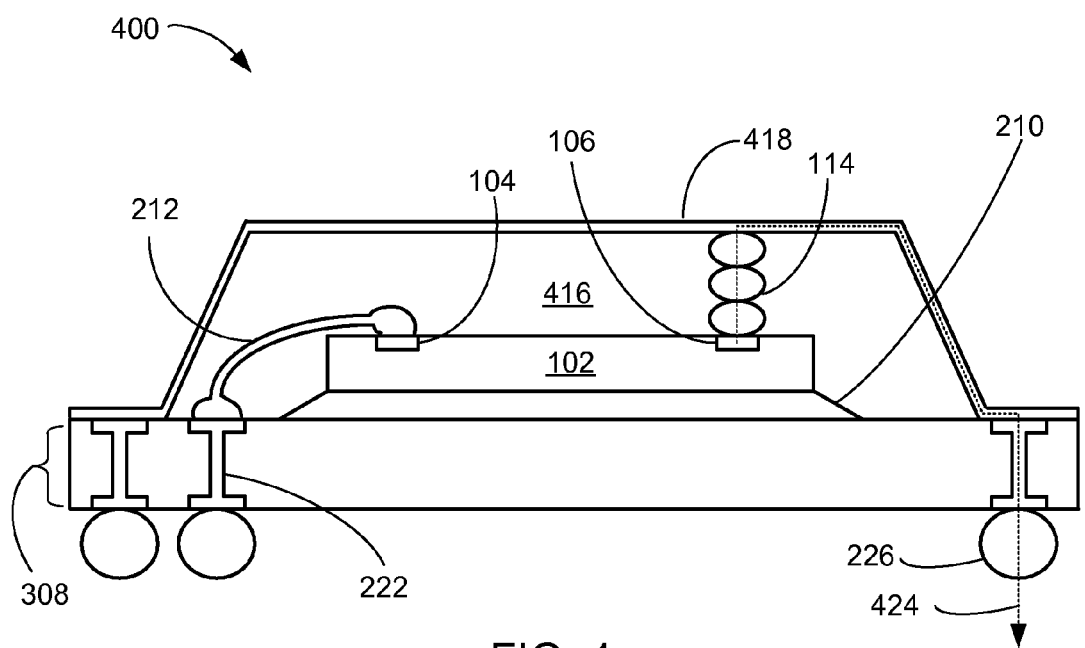
FIG. 4 is a cross-sectional view of a package system with electromagnetic interference shielding in an embodiment of a package stacking configuration.

Referring now to FIG. 4, therein is shown a cross-sectional view of a package system 400 with electromagnetic interference shielding in an embodiment of a package stacking configuration. In the package system 400, the semiconductor die 102 is mounted on the package substrate 308 using the adhesive layer 210. The bond wire 212 provides an electrical connection between the contact pad 104 in the semiconductor die 102 and the conductive through connector 222 in the package substrate 308.

The vertical conductive structure 114 provides an electrical connection between the ground pad 106 and a shielding layer 418. In this embodiment of the invention, the shielding layer 418 is connected directly to the conductive through connector 222 in the package substrate 308. At least portions of the package substrate 308, the semiconductor die 102, the bond wire 212, and the vertical conductive structure 114 are surrounded by an encapsulant 416.

In one embodiment of the invention, the vertical conductive structure 114 is formed using a stack of conductive bumps, such as gold stud bumps or solder balls. In an alternate embodiment of the invention, the vertical conductive structure 114 is formed by extruding a conductive bump to form a metal pillar. Materials used to form the vertical conductive structure include gold (Au), copper (Cu), aluminum (Al), their alloys, and solder materials.

The shielding layer 418 is provided to protect the package system 400 from electromagnetic interference (EMI). The shielding layer 418 may be a metal, metal alloy, a conductive polymer, or a conductive ceramic. A path to ground 424 is defined by the ground pad 106, the vertical conductive structure 114, the shielding layer 318, the conductive through connector 222, and the conductive bump or ball 226. The shielding layer 418 is only on an exterior of the encapsulant 416 and forms the path to ground 424 from the vertical conductive structure 114 through the shielding layer 418 and through the package substrate 308.

Figure 5:
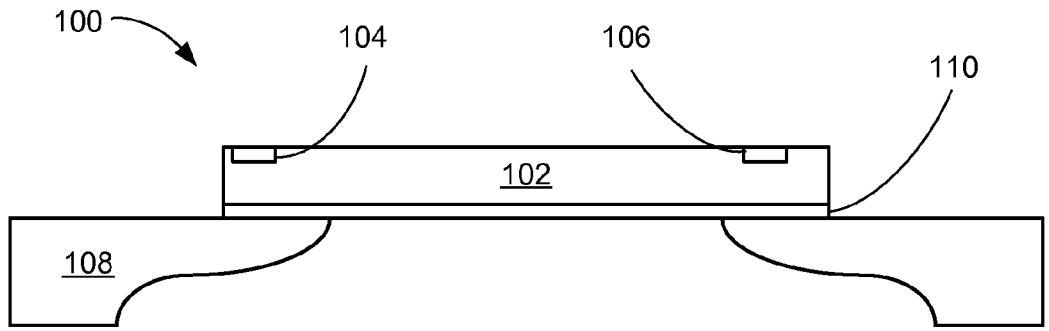
FIG. 5 is the package system of FIG. 1 at the initial stages of the fabrication process.

Referring now to FIG. 5, therein is shown the package system 100 of FIG. 1 at the initial stages of the fabrication process. At this stage of the process, the semiconductor die 102 with the contact pad 104 and the ground pad 106 is already bonded to the leadframe 108 using the adhesive layer 110.

Figure 6:
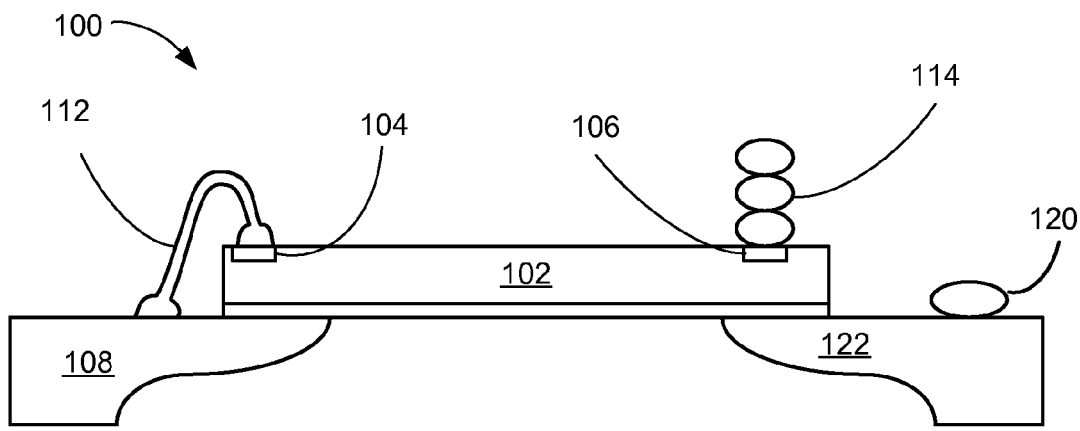
FIG. 6 is the structure of FIG. 5 following the placement of connection structures.

Referring now to FIG. 6, therein is shown the structure of FIG. 5 following the placement of connection structures. The contact pad 104 is connected to the leadframe 108 using the bond wire 112, the vertical conductive structure 114 is fabricated on top of the ground pad 106, and the conductive bump or ball 120 is placed on the ground lead 122. In one embodiment of the invention, the vertical conductive structure 114 is formed using a stack of conductive bumps or solder balls. Materials used to form the vertical conductive structure include gold (Au), copper (Cu), aluminum (Al), their alloys, and solder materials.

Figure 7:
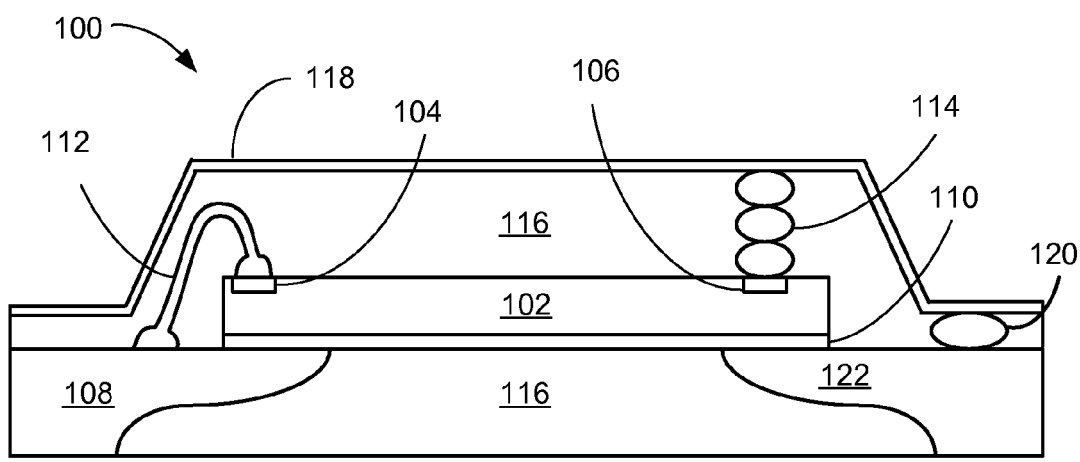
FIG. 7 is the structure of FIG. 6 following encapsulation of the package system and capping with the shielding layer.

Referring now to FIG. 7, therein is shown the structure of FIG. 6 following encapsulation of the package system 100 and capping with the shielding layer 118. The shielding layer 118 may be formed using a metal, a conductive resin or epoxy, or a conductive foil. Moreover, the shielding layer 118 may be coated on top of the encapsulant 116 by fabrication methods known in the art such as plating, sputtering, spraying, and painting.

Figure 8:
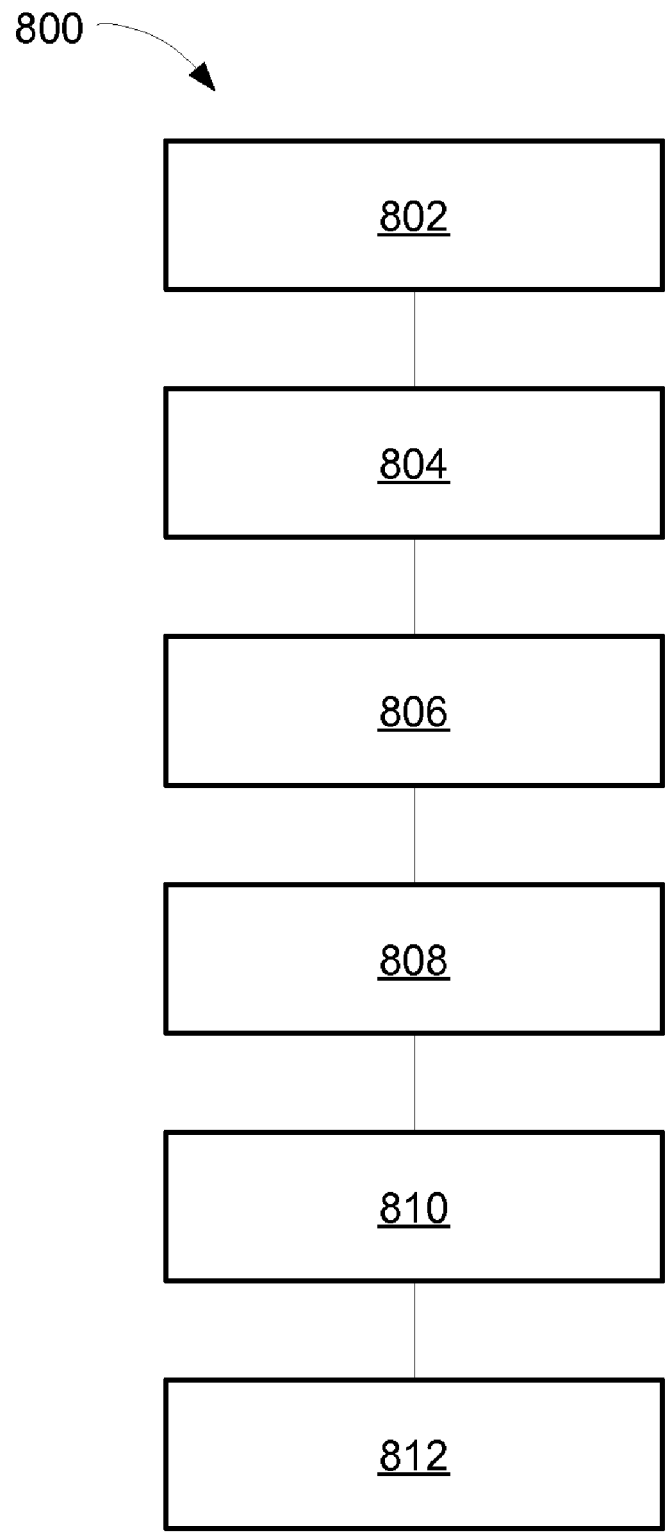
FIG. 8 is a flow chart of a package system for shielding semiconductor dies from electromagnetic interference in an embodiment of the present invention.

Referring now to FIG. 8, therein is shown a flow chart of a package system 800 for manufacturing a package system with electromagnetic interference shielding in an embodiment of the present invention. The package system 800 includes providing a semiconductor die with a contact pad and a ground pad in a block 802; mounting the semiconductor die on a package substrate using and adhesive layer in a block 804; forming a vertical conductive structure on top of the ground pad in the semiconductor die in a block 806; encapsulating at least portions of the semiconductor die, the vertical conductive structure, and package substrate using an encapsulant in a block 808; covering at least portions of the encapsulant and the vertical conductive structure with a shielding layer to place the vertical conductive structure in electrical contact with the shielding layer in a block 810; and, connecting the shielding layer to the package substrate in a block 812.

It has been discovered that the present invention thus has numerous aspects.

A principal aspect that has been unexpectedly discovered is that the present invention is that the package system provides electromagnetic interference shielding surrounding the package system, including lateral portions of the system.

Another aspect is that the invention provides effective means for grounding the shielding layer minimizing the number of bond wires needed to perform that function. This aspect is particularly relevant to small chip-on-lead (COL) packages that may have a limited number of leads available for ground connections.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the package system of the present invention furnishes important and heretofore unknown and unavailable solutions, capabilities, and functional aspects for providing electromagnetic interference shielding for semiconductor packages. The resulting processes and configurations are straightforward, cost-effective, uncomplicated, highly versatile and effective, can be surprisingly and unobviously implemented by adapting known technologies, and are thus readily suited for efficiently and economically manufacturing semiconductor packages fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a package system comprising:
    providing a semiconductor die with a contact pad and a ground pad;
    mounting the semiconductor die on a package substrate using an adhesive layer;
    forming a vertical conductive structure as a sole path to ground on top of the ground pad in the semiconductor die;
    encapsulating at least portions of the semiconductor die, the vertical conductive structure, and package substrate using an encapsulant;
    covering at least portions of the encapsulant and the vertical conductive structure with a shielding layer to place the vertical conductive structure in electrical contact with the shielding layer; and
    connecting the shielding to the package substrate.

2. The method as claimed in claim 1 wherein mounting the semiconductor die uses a leadframe as the package substrate.

3. The method as claimed in claim 1 wherein connecting the shielding layer to the package substrate is performed using a conductive bump or ball placed between the shielding layer and the package substrate.

4. The method as claimed in claim 1 wherein connecting the shielding layer to the package substrate is performed by placing a portion of the shielding layer on the package substrate.

5. The method as claimed in claim 1 further comprising forming a connection between the ground pad and the package substrate using a bond wire and wherein the forming of the vertical conductive structure is performed on top of the end of the bond wire at the ground pad.

6. A method for manufacturing a package system comprising:
providing a semiconductor die with a contact pad and ground pad;
mounting the semiconductor die on a package substrate using and adhesive layer;
connecting the contact pad in the semiconductor die to the package substrate using a bond wire;
forming a vertical conductive structure as a sole path to ground on top of the ground pad in the semiconductor die;
encapsulating at least portions of the semiconductor die, the vertical conductive structure, the bond wire, and the package substrate using an encapsulant;
covering at least portions of the encapsulant and the vertical conductive structure with a shielding layer to place the vertical conductive structure in asymmetrical electrical contact with the shielding layer; and
connecting the shielding layer to the package substrate.

7. The method as claimed in claim 6 wherein mounting the semiconductor die is performed on a leadframe.

8. The method as claimed in claim 6 wherein forming the vertical conductive structure is performed by stacking gold stud bumps.

9. The method as claimed in claim 6 wherein forming the vertical conductive structure is performed by extruding a gold stud bump.

10. The method as claimed in claim 6 further comprising removing a top portion of the encapsulant to expose the top surface of the vertical conductive structure prior to covering at least portions of the encapsulant and the vertical conductive structure with a shielding layer.

11. A package system comprising:
a semiconductor die with a contact pad and a ground pad;
a package substrate for supporting the semiconductor die;
a vertical conductive structure as a sole path to ground defined on top of the ground pad;
an encapsulant for encapsulation of at least portions of the semiconductor die and the vertical conductive structure; and
a shielding layer connected to the vertical conductive structure for providing shielding from electromagnetic interference.

12. The system as claimed in claim 11 wherein the package substrate is a leadframe.

13. The system as claimed in claim 11 further comprising a bond wire for connecting the contact pad to portions of the package substrate.

14. The system as claimed in claim 11 further comprising bond wire for connecting the contact pad to portions of the package substrate and wherein the vertical conductive structure is placed on top of the end of the bond wire at the ground pad.

15. The system as claimed in claim 11 further comprising a conductive bump or ball for connecting the package system on another package substrate in a stacked configuration.

16. The system as claimed in claim 11 wherein the shielding layer is connected to the package substrate.

17. The system as claimed in claim 16 wherein the shielding layer is connected to the package substrate using a solder bump or ball.

18. The system as claimed in claim 16 wherein the vertical conductive structure is composed of vertically stacked gold stud bumps.

19. The system as claimed in claim 16 wherein the vertical conductive structure is composed of an extruded gold stud bump.

20. The system as claimed in claim 16 wherein the top surface of the vertical conductive structure is in electrical contact with the shielding layer.

* * * * *